United States Patent
Yamagishi

(10) Patent No.: US 8,762,812 B2
(45) Date of Patent: Jun. 24, 2014

(54) DECODING DEVICE, DECODING METHOD, AND PROGRAM

(75) Inventor: Hiroyuki Yamagishi, Tokyo (JP)

(73) Assignee: Sony Corporation, Tokyo (JP)

(*) Notice: Subject to any disclaimer, the term of this patent is extended or adjusted under 35 U.S.C. 154(b) by 200 days.

(21) Appl. No.: 13/357,840

(22) Filed: Jan. 25, 2012

(65) Prior Publication Data
US 2012/0173954 A1    Jul. 5, 2012

(30) Foreign Application Priority Data
Jan. 3, 2011   (JP) .................... 2011-043720

(51) Int. Cl.
| H03M 13/00 | (2006.01) |
| H03M 13/03 | (2006.01) |
| H04L 27/06 | (2006.01) |
| H04L 5/12  | (2006.01) |
| H03M 13/37 | (2006.01) |
| H03M 13/11 | (2006.01) |
| H03M 13/13 | (2006.01) |
| H03M 13/35 | (2006.01) |
| H03M 13/29 | (2006.01) |
| H04L 1/06  | (2006.01) |
| H04L 1/00  | (2006.01) |

(52) U.S. Cl.
CPC ...... *H03M 13/3753* (2013.01); *H03M 13/1102* (2013.01); *H03M 13/134* (2013.01); *H03M 13/3738* (2013.01); *H03M 13/3746* (2013.01); *H03M 13/35* (2013.01); *H03M 13/37* (2013.01); *H03M 13/2951* (2013.01); *H03M 13/2975* (2013.01); *H03M 13/296* (2013.01); *H04L 1/0625* (2013.01); *H04L 1/0631* (2013.01); *H04L 1/0051* (2013.01); *H04L 1/0061* (2013.01); *H04L 1/0064* (2013.01)

USPC .......... 714/760; 714/752; 714/758; 714/785; 714/786; 714/793; 375/240.24; 375/240.27; 375/262; 375/341

(58) Field of Classification Search
CPC ... H04L 1/0625; H04L 1/0631; H04L 1/0051; H04L 1/0061; H04L 1/0064; H03M 13/1102; H03M 13/134; H03M 13/3738; H03M 13/3746; H03M 13/3753; H03M 13/35; H03M 13/37; H03M 13/2951; H03M 13/2975; H03M 13/296
USPC ................ 714/760, 752, 758, 785, 786, 793; 375/240.24, 240.27, 262, 341
See application file for complete search history.

(56) References Cited

U.S. PATENT DOCUMENTS

| 6,944,803 | B2* | 9/2005 | Hunt | ............................. 714/701 |
| 7,103,825 | B2* | 9/2006 | Yedidia et al. | ................ 714/760 |

(Continued)

FOREIGN PATENT DOCUMENTS

| JP | 2008-16959  | 1/2008 |
| JP | 2008-527760 | 7/2008 |

OTHER PUBLICATIONS

Zhang, Shuffled Iterative Decoding, Feb. 2005, IEEE, vol. 53, No. 2, pp. 209-213.*

(Continued)

*Primary Examiner* — John J Tabone, Jr.
(74) *Attorney, Agent, or Firm* — Sony Corporation

(57) ABSTRACT

A decoding device includes: a determination unit that determines whether or not a decoding ending condition is satisfied at an interval shorter than an interval of one decoding process in repeated decoding and ends the process in the middle of the one decoding process in a case where the decoding ending condition is satisfied.

12 Claims, 10 Drawing Sheets

(56) References Cited

U.S. PATENT DOCUMENTS

| | | | |
|---|---|---|---|
| 7,373,585 B2* | 5/2008 | Yedidia et al. | 714/786 |
| 7,389,464 B2* | 6/2008 | Jeong et al. | 714/752 |
| 7,676,734 B2* | 3/2010 | Yamagishi | 714/780 |
| 7,810,014 B2* | 10/2010 | Kim et al. | 714/758 |
| 8,010,869 B2* | 8/2011 | Wehn et al. | 714/758 |
| 8,074,156 B2* | 12/2011 | Yokokawa et al. | 714/794 |
| 8,171,375 B2* | 5/2012 | Lin et al. | 714/758 |
| 8,184,712 B2* | 5/2012 | Mukherjee | 375/240.21 |
| 8,196,005 B2* | 6/2012 | Kienle et al. | 714/755 |
| 8,261,170 B2* | 9/2012 | Yedidia et al. | 714/794 |
| 8,640,010 B2* | 1/2014 | Miyauchi et al. | 714/780 |
| 2004/0109507 A1* | 6/2004 | Kanter et al. | 375/259 |
| 2008/0052594 A1* | 2/2008 | Yedidia et al. | 714/758 |
| 2009/0158127 A1* | 6/2009 | Miyauchi et al. | 714/780 |
| 2011/0138255 A1* | 6/2011 | Lee | 714/777 |
| 2013/0061112 A1* | 3/2013 | Chen et al. | 714/758 |

OTHER PUBLICATIONS

M. M. Mansour, et al., "Turbo Decoder Architectures for Low-Density Parity-Check Codes", IEEE, 2002, pp. 1383-1388.

R.G. Gallager, "Low-Density Parity-Check Codes*", IRE Transactions on Information Theory, Jan. 1962, pp. 21-28.

T. Lehnigk-Emden, et al., "Enhanced Iteration Control for Ultra Low Power LDPC Decoding" ICT—MobileSummit 2008 Conference Proceedings, (www.ICT-MobileSummit.eu/2008), 2008, pp. 1-9.

J. Zhang, et al "Shuffled Belief Propagation Decoding", IEEE, 2002, pp. 8-15.

* cited by examiner

FIG. 1
PRIOR ART

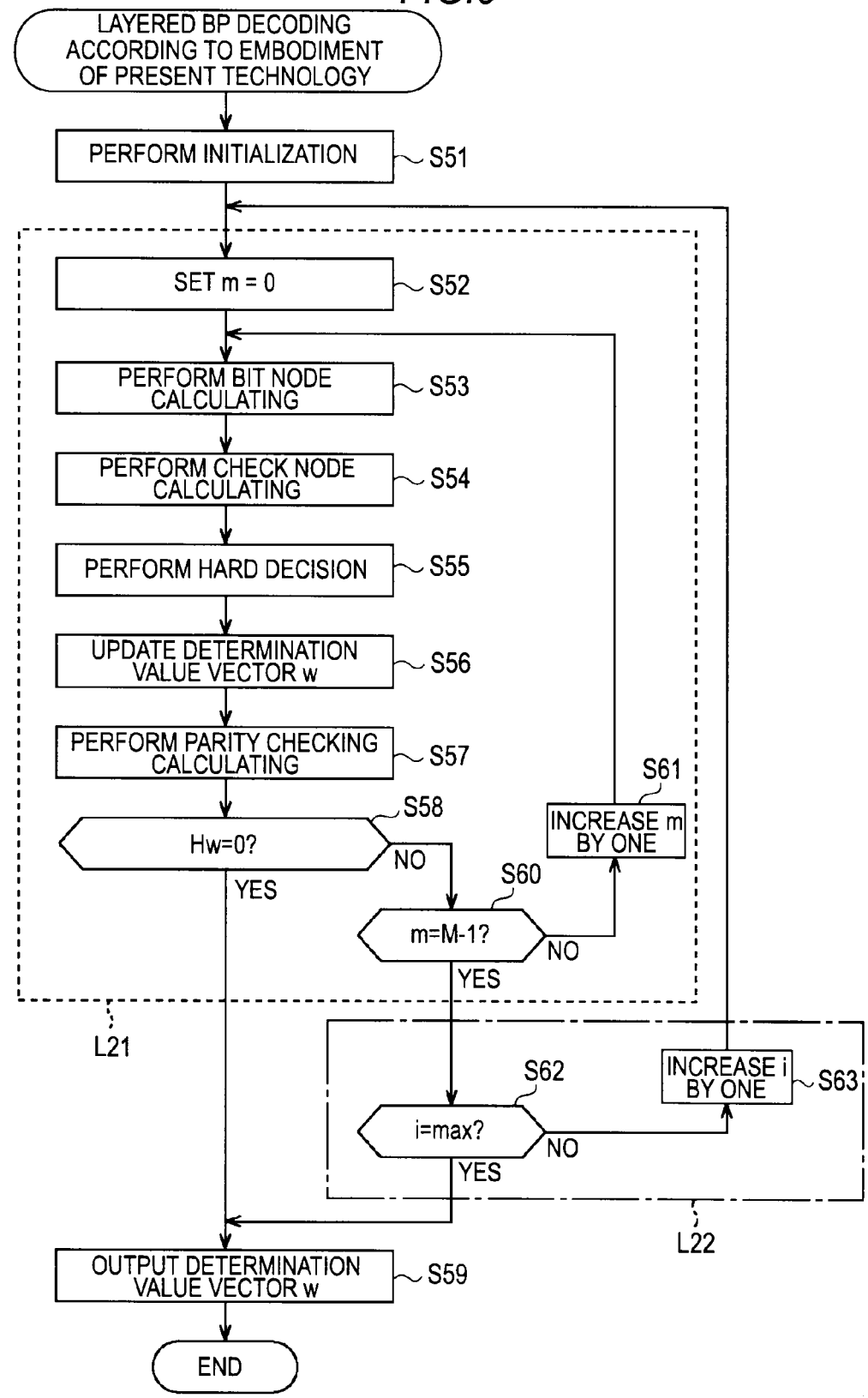

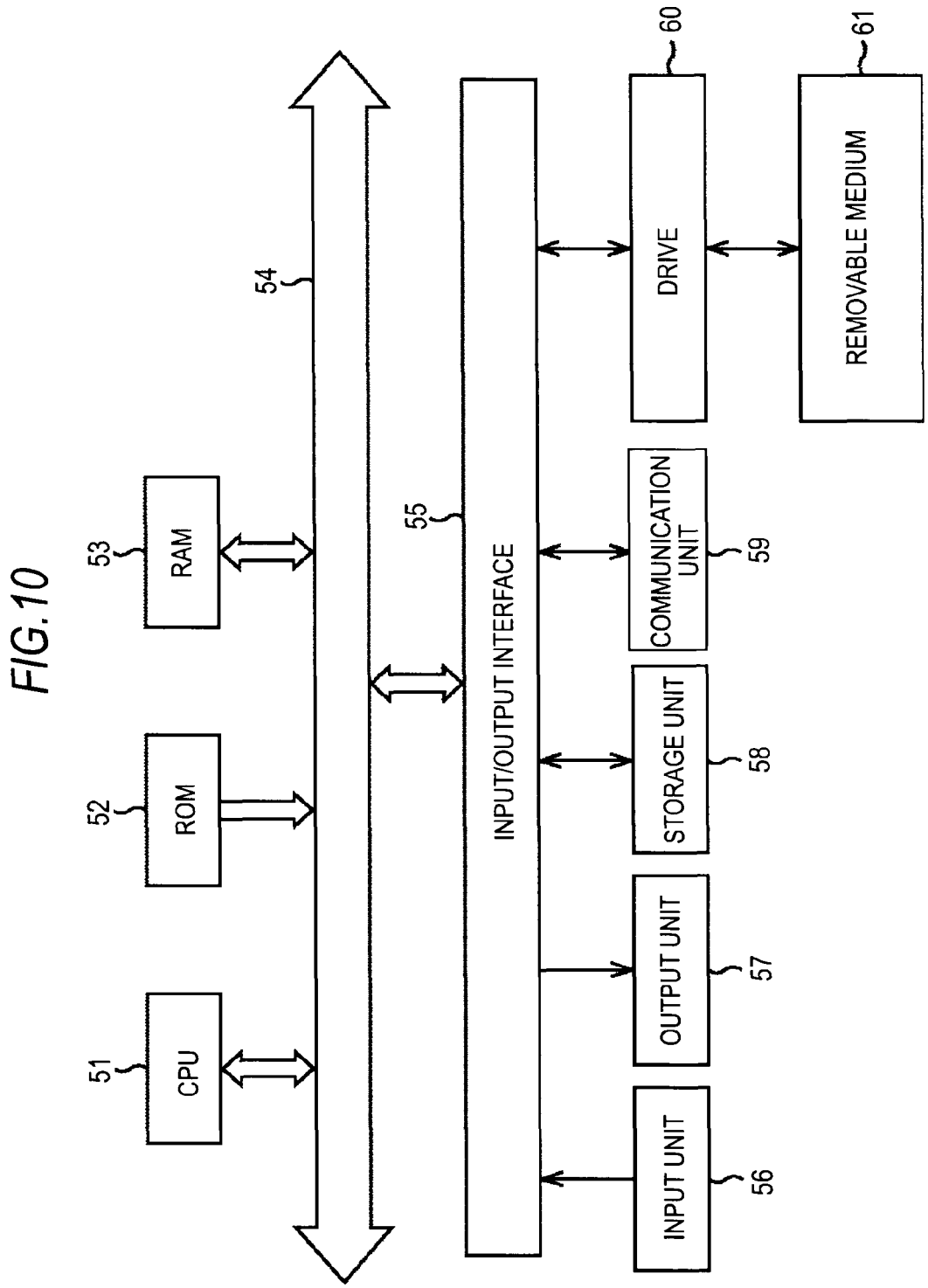

DECODING DEVICE, DECODING METHOD, AND PROGRAM

FIELD

The present disclosure relates to a decoding device, a decoding method, and a program, and, more particularly, to a decoding device, a decoding method, and a program capable of decreasing the amount of repeated decoding.

BACKGROUND

[LDPC Code]

Recently, as an error correction code (ECC), an LDPC (Low Density Parity Check) code has attracted attention (R. G. Gallager, "Low-density parity-check codes," IRE Trans. Inform. Theory, vol. IT-8, pp. 21-28, January 1962.) The LDPC code is featured such that a parity checking matrix defining the code is sparsely arranged. A sparsely-arranged matrix represents a matrix in which the number of elements of "1" is configured to be small.

Figure 1:
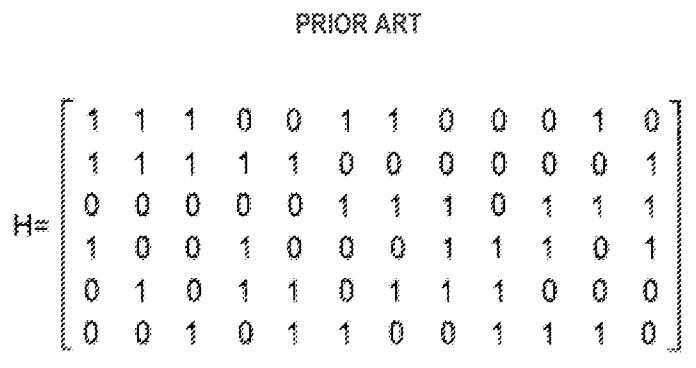

FIG. 1 is a diagram illustrating an example of a parity checking matrix of a (12,6) LDPC code.

The parity checking matrix H illustrated in FIG. 1 is a matrix in which the weight (the number of "1"s") of each column is "3", and the weight of each row is "6". The encoding according to the LDPC code is realized by generating a generation matrix G based on the parity checking matrix H and generates a code word by multiplying the generation matrix G by binary information.

More specifically, an encoding device that performs encoding according to the LDPC calculates a generation matrix G that satisfies $GH^T=0$ with a transposed matrix $H^T$ of the parity checking matrix H. Here, in a case where the generation matrix G is a k×n matrix, the encoding device multiplies the generation matrix G by information configured by k bits so as to generate a code word configured by n bits. In the code word generated by the encoding device, a code bit having a value of "0" is mapped into "+1" and a code bit having a value of "1" is mapped into "−1", and the code word is transmitted and is received by the reception side through a predetermined communication line.

On the other hand, as a decoding method of the LDPC code, a method is known in which the parity checking matrix is represented as a bipartite graph, and the process is repeatedly performed while likelihood information is exchanged between a check node and a bit node.

FIG. 2 is a diagram illustrating a bipartite graph of the parity checking matrix H illustrated in FIG. 1.

White rectangles illustrated on the upper side of FIG. 2 represent check nodes, and white circles illustrated on the lower side represent bit nodes. The check node corresponds to a row of the parity checking matrix, and the bit node corresponds to a column of the parity checking matrix. In a case where elements, which are other than "0", of the parity checking matrix H are associated with connections between nodes, as illustrated in FIG. 2, the check nodes and the bit nodes are connected to each other at the edges.

[BP Decoding in Related Art]

Here, BP (Belief Propagation) decoding as one of methods of decoding the LDPC code will be described.

Here, a code bit length is denoted by N, and a parity checking matrix having the number of parity checking rows of M is denoted by $H=[H_{mn}]$. In addition, m denotes the row number (check node number) and has a value in the range of $0 \le m < M$. Furthermore, n denotes a column number (bit node number) and has a value in the range of $0 \le n \le N$. In addition, a set of bit numbers used for the m-th parity checking calculation is denoted by $N(m)=\{n|H_{mn}=1\}$, and a set of the parity checking numbers for which a parity checking operation is performed by using the n-th bit is denoted by $M(n)=\{m\beta-H_{mn}=1\}$. $N(m)=\{n|H_{mn}=1\}$ represents a set of bit nodes connected to the m-th check node (check node m), and $M(n)=\{m|H_{mn}=1\}$ represents a set of check nodes connected to the n-th bit node (bit node n).

The initial likelihood acquired from the reception value of the n-th bit is denoted by $F_n$, the likelihood from the check node m to the bit node n in the i-th decoding process is denoted by $\epsilon_{mn}^{(i)}$, and the likelihood from the bit node n to the check node m n in the i-th decoding process is denoted by $z_{mn}^{(i)}$. In addition, the posterior likelihood of bit n acquired by the i-th decoding process is denoted by $z_n^{(i)}$. The repeated decoding is realized by repeatedly performing a decoding process for the maximum number of times set in advance. In such a case, the BP decoding is represented as below.

Initialization:

An LDPC decoding circuit sets 1 to i.

The LDPC decoding circuit sets $F_n$ to each $z_{mn}^{(0)}$.

Step 1:

(i) Check Node Calculating

The LDPC decoding circuit acquires $\epsilon_{mn}^{(i)}$ by using the following Equations (1) and (2) for all the values of n and all the values of m satisfying "$m \in M(n)$". In Equation (1), n' represents a bit node acquired by excluding n from the bit nodes included in N(m).

$$\tau_{mn}^{(i)} = \prod_{n' \in N(m) \setminus n} \tanh(z_{mn'}^{(i-1)}/2) \quad (1)$$

$$\varepsilon_{mn}^{(i)} = \log \frac{1 + \tau_{mn}^{(i)}}{1 - \tau_{mn}^{(i)}} \quad (2)$$

(ii) Bit Node Calculating

For all the values of m and all the values of n satisfying "$n \in N(m)$", the LDPC decoding circuit acquires $z_{mn}^{(i)}$ by using the following Equation (3) and acquires $z_n^{(i)}$ by using the following Equation (4). In Equation (3), m' represents check nodes acquired by excluding m from the check nodes included in M(n).

$$z_{mn}^{(i)} = F_n + \sum_{m' \in M(n) \setminus m} \varepsilon_{m'n}^{(i)} \quad (3)$$

$$z_n^{(i)} = F_n + \sum_{m \in M(n)} \varepsilon_{mn}^{(i)} \quad (4)$$

Step 2:

(i) Hard Decision

The LDPC decoding circuit performs a hard decision as $w_n^{(i)}=1$ in a case where $z_n^{(i)}>0$ and as $w_n^{(i)}=0$ in a case where $z_n^{(i)}<0$. In addition, the LDPC decoding circuit acquires a determination value vector $w^{(i)}=[w_n^{(i)}]$ that has hard decision values (bit determining values) as its elements based on the result of the hard decision.

(ii) Decoding Ending Condition Determining

The LDPC decoding circuit performs a parity checking calculation that is the calculation of a parity checking equation $Hw^{(i)}$. In a case where the parity checking equation $Hw^{(i)}=0$ is satisfied, in other words, in a case where the following Equation (5) is satisfied for $0 \le m < M$, or in a case the number i of repetitions of the decoding process arrives at the maximum number of times set in advance, the LDPC decoding circuit performs the process of Step 3. On the other hand, in the other cases, the LDPC decoding circuit increases i by one and performs the process of Step 1.

$$\sum_{n \in N(m)} H_{mn} w_n^{(i)} = 0 \quad (5)$$

Step 3:

The LDPC decoding circuit outputs a determination value vector $w^{(i)}$ as a result of the decoding process.

In the BP decoding, after all the check node calculations are completed in the first decoding process as described above, all the bit node calculations are performed. In other words, $\epsilon_{mn}^{(i)}$ in the check node calculating of Step 1 (i) is acquired, and $z_{mn}^{(i)}$ and $z_n^{(i)}$ are acquired in the bit node calculating of (ii) by using the result thereof.

[Group Shuffled BP Decoding in Related Art]

However, in the repeated decoding of the LDPC code, a method for decreasing the number of times until the decoding converges is proposed (J. Zhang and M. Fossorier, "Shuffled belief propagation decoding" Proc. 36th Annu. Asilomar Conf. Signals, Syst., Computers, pp. 8-15, November 2002 and M. M. Mansour and N. R. Shanbhag, "Turbo decoder architecture for low-density parity-check codes" Proc. Global Telecommun. Conf., pp. 1383-1388, November 2002).

In J. Zhang and M. Fossorier, "Shuffled belief propagation decoding" Proc. 36th Annu. Asilomar Conf. Signals, Syst., Computers, pp. 8-15, November 2002, group shuffled BP decoding in which the bit node calculating is performed in a divisional manner is described. In addition, in JP-T-2008-527760, a decoding circuit in which replica coupling is formed by using a plurality of group shuffled BP decoding circuits is disclosed. In addition, in JP-A-2008-16959, a decoding device and a decoding method that can effectively perform decoding by changing the update schedule of the likelihood in a shuffled BP decoding circuit are disclosed.

Next, group shuffled BP decoding will be described. The group shuffled BP decoding is represented as bellows. The number of groups dividing the bit nodes is denoted by G, and it is assumed that the number of bit nodes processed in each group is $N_g = N/G$.

Initialization:

An LDPC decoding circuit sets 1 to i.

The LDPC decoding circuit sets $F_n$ to each $z_{mn}^{(0)}$.

Step 1:

The LDPC decoding circuit repeats (i) check node calculating and (ii) bit node calculating while changing a variable g representing the group of bit nodes as a processing target from 0 to G−1. In other words, the LDPC decoding circuit performs the check node calculating and the bit node calculating for the first group out of G check node groups as a target. Next, the LDPC decoding circuit performs the check node calculating and the bit node calculating for the second group as a target and thereafter, performs the check node calculating and the bit node calculating by sequentially setting the third group and a group after that as a target.

(i) Check Node Calculating

The LDPC decoding circuit acquires $\epsilon_{mn}^{(i)}$ by using the following Equations (6) and (7) for n satisfying "$gN_g \leq n < (g+1)N_g$" and m satisfying "$m \in M(n)$".

$$\tau_{mn}^{(i)} = \left( \prod_{\substack{n' \in N(m) \setminus n \\ n' < gN_g}} \tanh(z_{mn'}^{(i)}/2) \right) \left( \prod_{\substack{n' \in N(m) \setminus n \\ n' \geq gN_g}} \tanh(z_{mn'}^{(i-1)}/2) \right) \quad (6)$$

$$\epsilon_{mn}^{(i)} = \log \frac{1 + \tau_{mn}^{(i)}}{1 - \tau_{mn}^{(i)}} \quad (7)$$

(ii) Bit Node Calculating

For n satisfying "$gN_g \leq n < (g+1)N_g$" and m satisfying "$m \in M(n)$", the LDPC decoding circuit acquires $z_{mn}^{(i)}$ by using the following Equation (8) and acquires $z_n^{(i)}$ by using the following Equation (9).

$$z_{mn}^{(i)} = F_n + \sum_{m' \in M(n) \setminus m} \epsilon_{m'n}^{(i)} \quad (8)$$

$$z_n^{(i)} = F_n + \sum_{m \in M(n)} \epsilon_{mn}^{(i)} \quad (9)$$

Step 2:

(i) Hard Decision

The LDPC decoding circuit performs a hard decision as $w_n^{(i)}=1$ in a case where $z_n^{(i)}>0$ and as $w_n^{(i)}=0$ in a case where $z_n^{(i)}<0$. In addition, the LDPC decoding circuit acquires a determination value vector $w^{(i)}=[w_n^{(i)}]$ based on the result of the hard decision.

(ii) Decoding Ending Condition Determining

In a case where the parity checking equation $H_w^{(i)}=0$ is satisfied, in other words, in a case where the following Equation (10) is satisfied for $0 \leq m < M$, or in a case the number of repetitions of the decoding process arrives at the maximum number of times set in advance, the LDPC decoding circuit performs the process of Step 3. On the other hand, in the other cases, the LDPC decoding circuit increases i by one and performs the process of Step 1.

$$\sum_{n \in N(m)} H_{mn} w_n^{(i)} = 0 \quad (10)$$

Step 3:

The LDPC decoding circuit outputs a determination value vector $w^{(i)}$ as a result of the decoding process.

FIG. 3 is a block diagram illustrating the configuration of an LDPC decoding circuit that performs the above-described group shuffled BP decoding.

The LDPC decoding circuit 1 illustrated in FIG. 3 is configured by a check node calculating circuit 11, a bit node calculating circuit 12, a hard decision circuit 13, a parity checking circuit 14, and an output circuit 15. To the checking node calculating circuit 11 and the bit node calculating circuit 12, the initial likelihood $F_n$ that is acquired from the reception value of the n-th bit is input.

The check node calculating circuit 11 acquires $\epsilon_{mn}^{(i)}$ by performing the check node calculating for a predetermined group of bit nodes as a target as described in the process of Step 1 (i). The check node calculating circuit 11 outputs $\epsilon_{mn}^{(i)}$ to the bit node calculating circuit 12.

The bit node calculating circuit 12, as described as the process of Step 1 (ii), acquires $z_{mn}^{(i)}$ and $z_n^{(i)}$ by performing the bit node calculating. The bit node calculating circuit 12 outputs $z_n^{(i)}$ to the hard decision circuit 13 and outputs $z_{mn}^{(i)}$ and $z_{mn}^{(i-1)}$ acquired from the previous ((i−1)-th) repeated decoding to the check node calculating circuit 11.

The hard decision circuit 13, as described as the process of Step 2 (i) performs a hard decision. The hard decision circuit 13 outputs the determination value vector $w_n^{(i)}$ to the parity checking circuit 14 and the output circuit 15.

The parity checking circuit 14, as described as the process of Step 2 (ii), decoding ending condition determining is performed. The parity checking circuit 14 performs the decoding ending condition determining once every time when the bit node calculating for N bit nodes, which is the same as the code bit length, is completed. In a case where the parity checking equation $Hw^{(i)}=0$ is not satisfied, and when the number of repetitions of the decoding process has not arrived at the maximum number of times set in advance, the decoding ending condition is determined not to be satisfied. On the other hand, in a case where the parity checking equation $Hw^{(i)}=0$ is satisfied, or the number of repetitions of the decoding process has arrived at the maximum number of times set in advance, the decoding ending condition is determined to be satisfied.

In a case where the decoding ending condition is determined not to be satisfied, the parity checking circuit outputs a control signal instructing to increase the variable i by one and repeat the decoding process to the check node calculating circuit 11 and the bit node calculating circuit 12. On the other hand, in a case where the decoding ending condition is determined to be satisfied, the parity checking circuit 14 outputs a signal indicating it to the output circuit 15.

In a case where the signal that indicates that the decoding ending condition is satisfied is supplied from the parity checking circuit 14, the output circuit 15 outputs the determination value vector $w_n^{(i)}$ as a result of the decoding.

[Layered BP Decoding in Related Art]

In M. M. Mansour and N. R. Shanbhag, "Turbo decoder architecture for low-density parity-check codes" Proc. Global Telecommun. Conf., pp. 1383-1388, November 2002, a decoding method known as turbo decoding or layered BP decoding is disclosed in which the check node calculating is performed by being divided into a plurality of processes. Next, the layered BP decoding will be described. The layered BP decoding is represented as below.

Initialization:
An LDPC decoding circuit sets 1 to i.
The LDPC decoding circuit sets 0 to each $\epsilon_{mn}^{(0)}$.

Step 1:
The LDPC decoding circuit repeats (i) check node calculating and (ii) bit node calculating, while changing a variable m representing the check node as a processing target from 0 to M−1.

(i) Bit Node Calculating
For n satisfying "n∈N(m)", the LDPC decoding circuit acquires $z_{mn}^{(i-1)}$ by using the following Equation (11).

$$z_{mn}^{(i-1)} = F_n + \sum_{\substack{m' \in M(n) \\ m' < m}} \varepsilon_{m'n}^{(i)} + \sum_{\substack{m' \in M(n) \\ m' > m}} \varepsilon_{m'n}^{(i-1)} \quad (11)$$

(ii) Check Node Calculating
The LDPC decoding circuit acquires $\epsilon_{mn}^{(i)}$ by using the following Equations (12) and (13) for n satisfying "n∈N(m)".

$$\tau_{mn}^{(i)} = \prod_{n' \in N(m) \setminus n} \tanh(z_{mn'}^{(i-1)}/2) \quad (12)$$

-continued $$\varepsilon_{mn}^{(i)} = \log \frac{1 + \tau_{mn}^{(i)}}{1 - \tau_{mn}^{(i)}} \quad (13)$$

Step 2:
(i) Hard Decision
The LDPC decoding circuit acquires $z_n^{(i)}$ for all the values of n by using the following Equation (14).

$$z_n^{(i)} = F_n + \sum_{m \in M(n)} \varepsilon_{mn}^{(i)} \quad (14)$$

In addition, the LDPC decoding circuit performs a hard decision as $w_n^{(i)}=1$ in a case where $z_n^{(i)}>0$ and as $w_n^{(i)}=0$ in a case where $z_n^{(i)}<0$. Furthermore, the LDPC decoding circuit acquires a determination value vector $w^{(i)}=[w_n^{(i)}]$ based on the result of the hard decision.

(ii) Decoding Ending Condition Determining
In a case where the parity checking equation $Hw^{(i)}=0$ is satisfied, in other words, in a case where the following Equation (15) is satisfied for 0≤m<M, or in a case the number i of repetitions of the decoding process arrives at the maximum number of times set in advance, the LDPC decoding circuit performs the process of Step 3. On the other hand, in the other cases, the LDPC decoding circuit increases i by one and performs the process of Step 1.

$$\sum_{n \in N(m)} H_{mn} w_n^{(i)} = 0 \quad (15)$$

Step 3:
The LDPC decoding circuit outputs a determination value vector $w^{(i)}$ as a result of the decoding process.

In Timo Lehnigk-Emden, Norbert When and Friedbert Berens, "Enhanced iteration control for ultra low power LDPC decoding" proceedings of ICT-MobileSummit 2008, a technique is disclosed in which it is determined before the repetition of the decoding process whether or not the hard decision of a reception word satisfies the condition of a code word, and the decoding process is not repeated in a case where the condition of the code word is satisfied.

SUMMARY

Generally, it is desirable for a device to consume low power, and this similarly applies to a device in which an LDPC decoding function is built in. Since the LDPC decoding is a decoding method in which power is consumed in accordance with the calculation amount, in order to realize low power consumption, realization of a decoding method in which the calculation amount is small is demanded.

Accordingly, it is desirable to decrease the calculation amount of the repeated decoding.

An embodiment of the present disclosure is directed to a decoding device including a determination unit that determines whether or not a decoding ending condition is satisfied at an interval shorter than an interval of one decoding process in repeated decoding and ends the process in the middle of the one decoding process in a case where the decoding ending condition is satisfied.

The decoding ending condition may be to satisfy a parity checking equation of a linear block code.

The linear block code may be an LDPC code.

A bit node calculating unit that divides a bit node calculation into a plurality of processes and performs the plurality of processes and a bit determining unit that acquires a partial bit determining value based on a result of the process performed in a divided manner and performs decoding every time the process divided by the bit node calculating unit is performed may be further included. In such a case, the determination unit may determine whether or not the decoding ending condition is satisfied based on the bit determining value acquired by the bit determining unit.

A syndrome storing unit that stores a syndrome acquired at a time when a determination of whether or not the decoding ending condition is satisfied is performed immediately before by the determination unit and a determining value storing unit that stores the bit determining value acquired by the bit determining unit at the time of the previous decoding process may be further included. In such a case, the determination unit may update the syndrome stored in the syndrome storing unit based on a difference between the bit determining value acquired by the bit determining unit in the decoding process of this time and the bit determining value stored in the bit determining value storing unit and determine whether or not the decoding ending condition is satisfied based on the updated syndrome.

The determination unit may determine whether or not the decoding ending condition is satisfied before starting a first decoding process and not perform the repeated decoding in a case where the decoding ending condition is satisfied.

A check node calculating unit that divides check node calculating into a plurality of processes and performs the plurality of processes may be further included. In such a case, the bit determining unit may acquire the bit determining value based on a result of the process performed in a divided manner every time the process divided by the check node calculating unit is performed.

Another embodiment of the present disclosure is directed to a decoding method and a program in which it is determined whether or not a decoding ending condition is satisfied at an interval shorter than an interval of one decoding process in repeated decoding, and the process is ended in the middle of the one decoding process in a case where the decoding ending condition is satisfied.

According to the embodiments of the present disclosure, the calculation amount in repeated decoding can be decreased.

BRIEF DESCRIPTION OF THE DRAWINGS

FIG. 1 is a diagram illustrating an example of a parity checking matrix.

FIG. 9 is a flowchart illustrating the flow of a layered BP decoding process according to an embodiment of the present disclosure.

FIG. 10 is a block diagram illustrating a configuration example of a computer.

DETAILED DESCRIPTION

Figure 2:
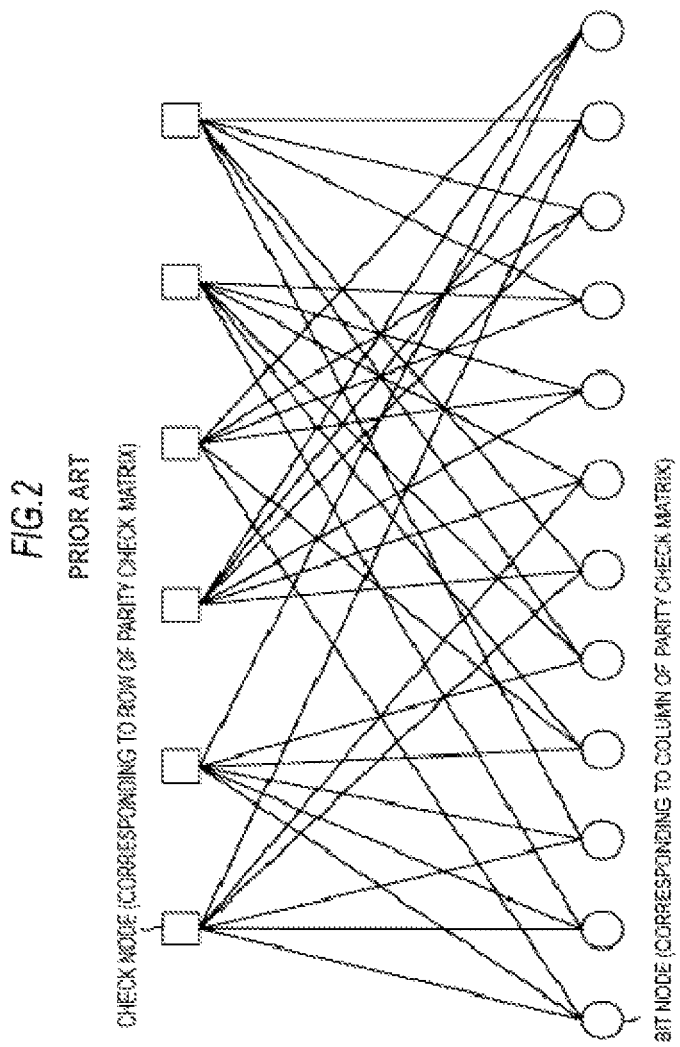
FIG. 2 is a diagram illustrating a bipartite graph of the parity checking matrix illustrated in FIG. 1.

Hereinafter, embodiments of the present disclosure will be described. The description will be presented in the following order.

1. First Embodiment (Modification of Group Shuffled BP Decoding)

2. Second Embodiment (Modification of Layered BP Decoding)

1. First Embodiment

[Modification of Group Shuffled BP Decoding]

According to general group shuffled BP decoding process, a hard decision and a decoding ending condition decision are performed every time the whole decoding calculation process of Step 1, which is configured by a check node calculation process and a bit node calculation process, is completed once. In contrast to this, according to the group shuffled BP decoding process according to the embodiment of the present disclosure, one decoding calculation process is divided, and a hard decision and a decoding ending condition determination are performed between the divided decoding calculation processes.

In a case where the decoding ending condition is determined to have been satisfied during the divided decoding calculation process, the process ends in the middle of the divided process without ending the entire decoding calculation process, whereby the amount of calculation can be decreased while maintaining the same decoding capability.

The group shuffled BP decoding process according to the embodiment of the present disclosure is represented as below.

Here, a code bit length is denoted by N, and a parity checking matrix having the number of parity checking rows of M is denoted by $H=[H_{mn}]$. In addition, m represents a row number (check node number) and has a value in the range of $0 \leq m < M$. Furthermore, n represents a column number (bit node number) and has a value in the range of $0 \leq n < N$. In addition, a set of bit numbers used for the m-th parity calculation process is denoted by $N(m)=\{n|H_{mn}=1\}$, and a set of parity checking numbers for which parity checking calculation is performed by using the n-th bit is denoted by $M(n)=\{m|H_{mn}=1\}$.

In addition, the initial likelihood acquired from the value of the received n-th bit is denoted by $F_n$, the likelihood from check node m to bit node n in the i-th decoding process is $\epsilon_{mn}^{(i)}$, and the likelihood from bit node n to check node m in the i-th decoding process is denoted by $z_{mn}^{(i)}$. The posterior likelihood of bit n that is acquired by the i-th decoding process is denoted by $z_n^{(i)}$. The number of groups acquired by dividing the bit node is denoted by G, and the number of bit nodes to be processed for each group is denoted by $N_g=N/G$.

Initialization:

An LDPC decoding circuit sets 1 to i.

The LDPC decoding circuit sets $F_n$ to each $z_{mn}^{(0)}$.

The LDPC decoding circuit performs the hard decision such that $w_n^{(0)}=1$ in a case where $F_n>0$ and $w_n^{(0)}=0$ in a case where $F_n<0$. In addition, the LDPC decoding circuit acquires a determination value vector $w=[w_n^{(0)}]$ based on the result of the hard decision.

Step 1:

The LDPC decoding circuit repeats (i) check node calculating, (ii) bit node calculating, (iii) a hard decision, and (iv) a decoding ending condition determination while changing a variable g representing the group of bit nodes as a processing target from 0 to G−1.

In other words, after the check node calculating and the bit node calculating are performed for the first group out of G groups of check nodes, the LDPC decoding circuit performs the hard decision and the decoding ending condition determination based on the result of the demodulation calculation of the first group as a target. In a case where the decoding ending condition is determined to be satisfied, the LDPC decoding circuit ends the process. On the other hand, in a case where the decoding ending condition is determined not to be satisfied, the LDPC decoding circuit sequentially performs the same process by sequentially setting the second group and after that as the target.

(i) Check Node Calculating

The LDPC decoding circuit acquires $\epsilon_{mn}^{(i)}$ by using the following Equations (16) and (17) for n satisfying "$gN_g \leq n < (g+1)N_g$" and m satisfying "$m \in M(n)$".

$$\tau_{mn}^{(i)} = \left( \prod_{\substack{n' \in N(m)\setminus n \\ n' < gN_g}} \tanh(z_{mn'}^{(i)}/2) \right) \left( \prod_{\substack{n' \in N(m)\setminus n \\ n' \geq gN_g}} \tanh(z_{mn'}^{(i-1)}/2) \right) \quad (16)$$

$$\varepsilon_{mn}^{(i)} = \log \frac{1 + \tau_{mn}^{(i)}}{1 - \tau_{mn}^{(i)}} \quad (17)$$

(ii) Bit Node Calculating

For n satisfying "$gN_g \leq n < (g+1)N_g$" and m satisfying "$m \in M(n)$", the LDPC decoding circuit acquires $z_{mn}^{(i)}$ by using the following Equation (18) and acquires $z_n^{(i)}$ by using the following Equation (19).

$$z_{mn}^{(i)} = F_n + \sum_{m' \in M(n)\setminus m} \varepsilon_{m'n}^{(i)} \quad (18)$$

$$z_n^{(i)} = F_n + \sum_{m \in M(n)} \varepsilon_{mn}^{(i)} \quad (19)$$

(iii) Hard Decision

For n satisfying "$gN_g \leq n < (g+1)N_g$", the LDPC decoding circuit performs a hard decision as $w_n^{(i)}=1$ in a case where $z_n^{(i)}>0$ and as $w_n^{(i)}=0$ in a case where $z_n^{(i)}<0$. By performing the hard decision, a partial hard decision value is acquired. In addition, the LDPC decoding circuit updates the n-th element of the determination value vector w from $w_n^{(i-1)}$ to $w_n^{(i)}$ based on the result of the hard decision.

(iv) Decoding Ending Condition Determining

The LDPC decoding circuit performs a parity checking calculation that is the calculation of a parity checking equation Hw. In a case where the parity checking equation Hw=0 is satisfied, in other words, in a case where the following Equation (20) is satisfied for 0≤m<M, the LDPC decoding circuit performs the process of Step 3. In the calculation of Equation (20), the result of the (i−1)-th decoding process is used, which is different from the calculation of Equation (10).

$$\sum_{\substack{n \in N(m) \\ n < (g+1)N_g}} H_{mn} w_n^{(i)} + \sum_{\substack{n \in N(m) \\ n \geq (g+1)N_g}} H_{mn} w_n^{(i-1)} = 0 \quad (20)$$

In a case where Equation (20) is not satisfied for 0≤m<M, and the current variable g is not G−1, the LDPC decoding circuit increases the variable g by one and continues the process of Step 1. On the other hand, in a case where Equation (20) is not satisfied for 0≤m<M, and the current variable g is G−1, the LDPC decoding circuit performs the process of Step 2.

Step 2:

In a case where the number of repetitions of the decoding process arrives at the maximum number of times set in advance, the LDPC decoding circuit performs the process of Step 3. On the other hand, in a case where the number of repetitions of the decoding process has not arrived at the maximum number of times set in advance, the LDPC decoding circuit increases i by one and performs the process of Step 1.

Step 3:

The LDPC decoding circuit outputs a determination value vector w as a result of the decoding process.

Figure 4:
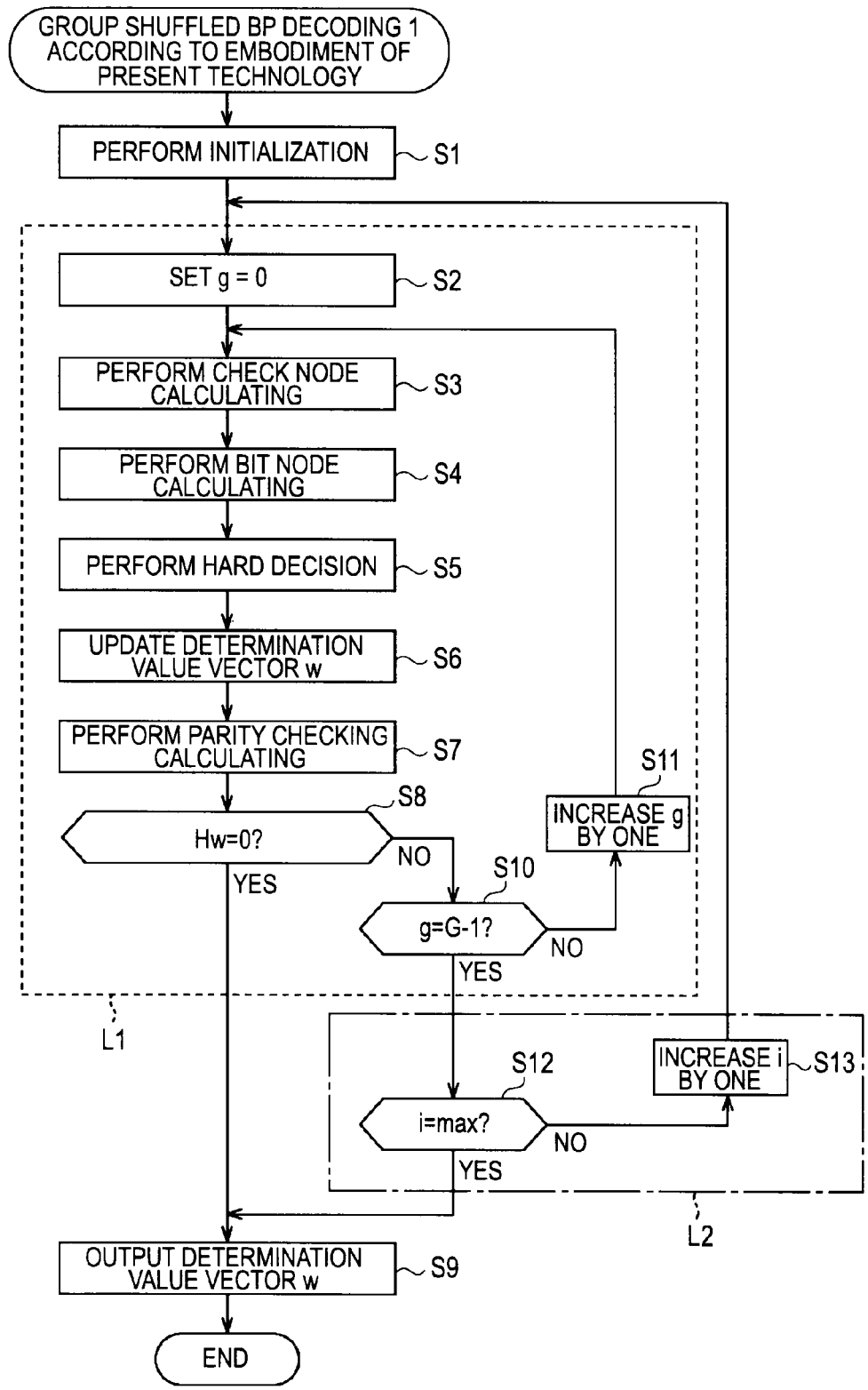
FIG. 4 is a flowchart illustrating the flow of a group shuffled BP decoding process according to an embodiment of the present disclosure.

A series of the flows described above is represented in the flowchart illustrated in FIG. 4. In FIG. 4, the process denoted by being enclosed by a broken line L1 corresponds to the process of Step 1, and the process denoted by being enclosed by a dashed dotted line L2 corresponds to the process of Step 2. Step S1 of FIG. 4 corresponds to the initialization, and Step S9 corresponds to the process of Step 3. As is appropriate, the correspondence between the process of each step and the configuration performing the process of each step will be described by using the configuration illustrated in FIG. 5 (to be described later).

The LDPC decoding circuit performs an initialization process in Step S1 and sets 0 to the variable g in Step S2. As the initialization, the process of setting one to i and the process of setting 0 to the variable g in Step S2 are performed by each circuit of the LDPC decoding circuit 1 illustrated in FIG. 5, and the process of setting Fn to each $z_{mn}^{(0)}$ is performed by a check node calculating circuit 11 and a bit node calculating circuit 12. In addition, the process of acquiring the determination value vector w=[$w_n^{(0)}$] is performed by a hard decision circuit 13 as initialization.

In addition, the LDPC decoding circuit performs check node calculating in Step S3 and performs bit node calculating in Step S4. The check node calculating of Step S3 is performed by the check node calculating circuit 11, and the bit node calculating of Step S4 is performed by the bit node calculating circuit 12.

The LDPC decoding circuit performs a hard decision in Step S5 and updates the determination value vector w based on the result of the hard decision in Step S6. The hard decision of Step S5 and the process of updating the determination value vector w of Step S6 are performed by the hard decision circuit 13.

The LDPC decoding circuit performs a parity checking calculation in Step S7 and determines whether or not the parity checking equation Hw=0 is satisfied in Step S8. The parity checking calculation of Step S7 and the determination of Step S8 are performed by a parity checking circuit 14. In a case where the parity checking equation Hw=0 is determined to be satisfied in Step S8, the LDPC decoding circuit outputs the determination value vector w in Step S9 and ends the process. The process of outputting the determination value vector w is performed by an output circuit 15.

On the other hand, in a case where the parity checking equation Hw=0 is determined not to be satisfied in Step S8, the LDPC decoding circuit determines whether or not the variable g is G−1 in Step S10. In a case where the variable g is determined not to be G−1 in Step S10, the variable g is increased by 1 in Step S11 and the process of Step S3 and after that are repeated. The determination of Step S10 is performed by using the parity checking circuit 14, and the process of Step S11 is performed by each circuit of the LDPC decoding circuit 1.

On the other hand, in a case where the variable g is determined to be G−1 in Step S10, the LDPC decoding circuit determines whether or not i has arrived at the maximum number of times in Step S12. In a case where i is determined not to have arrived at the maximum number of times in Step S12, the LDPC decoding circuit increases the value of the variable i by 1 in Step S13 and repeats the process of Step S2 and after that. The determination of Step S12 is performed by the parity checking circuit 14, and the process of Step S13 is performed by each circuit of the LDPC decoding circuit 1.

In a case where i is determined to have arrived at the maximum number of times in Step S12, the LDPC decoding circuit outputs the determination value vector w in Step S9 and ends the process.

In a group shuffled BP decoding process in the related art, even when a decoding result that satisfies the parity checking equation Hw=0 is acquired in the middle of the first decoding process, after the decoding calculation for all the groups of bit nodes is ended, decoding ending condition determining is performed. Accordingly, decoding calculations of G times are necessarily performed within one decoding process. On the other hand, in the group shuffled BP decoding process according to the embodiment of the present disclosure, a decoding ending condition is determined during the first decoding process, and accordingly, in a case where a decoding result that satisfies the parity checking equation Hw=0 is acquired through the g<(G−1)-th decoding calculation process, the remaining processes are not performed. Accordingly, the calculation amount can be decreased, and the power consumption of the device can be suppressed by reducing the calculation amount.

[Circuit Configuration]

Figure 3:
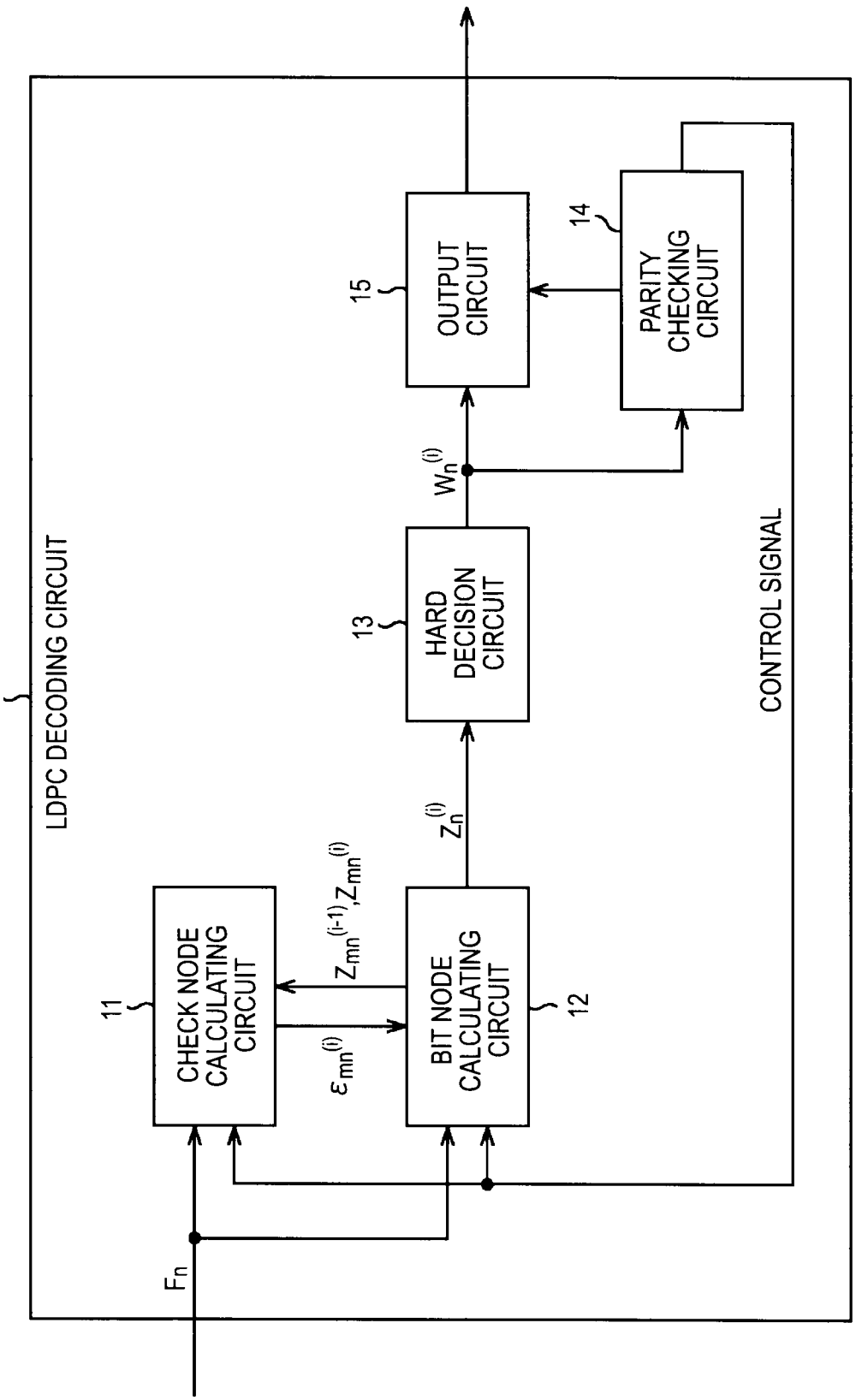
FIG. 3 is a block diagram illustrating the configuration of an LDPC decoding circuit.
Figure 5:
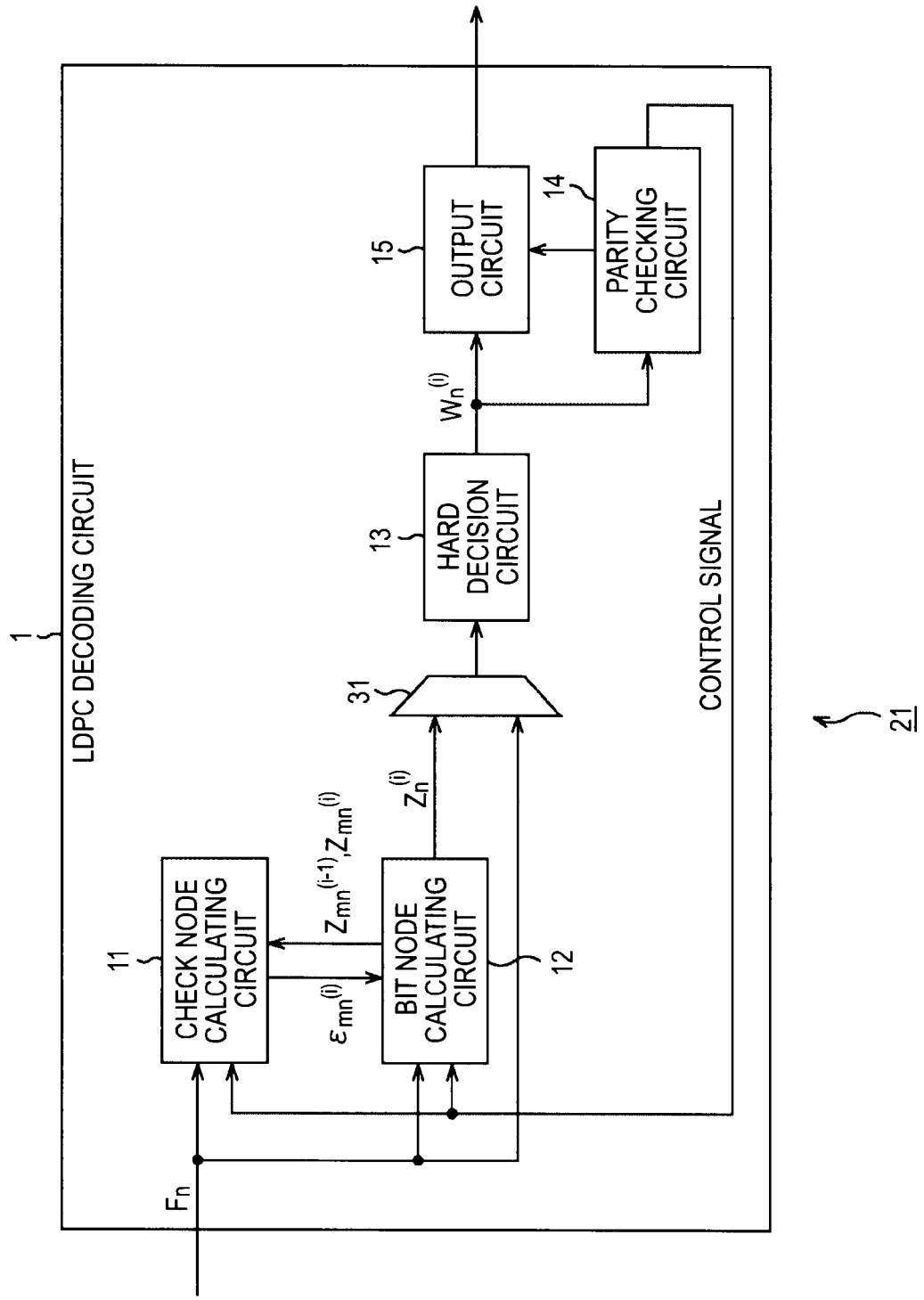
FIG. 5 is a block diagram illustrating a configuration example of a decoding circuit that performs the process illustrated in FIG. 4.

FIG. 5 is a block diagram illustrating a configuration example of an LDPC decoding circuit 1 that is disposed in a decoding device 21 according to the embodiment of the present disclosure. The same reference numeral is assigned to each configuration illustrated in FIG. 5 that is the same as the configuration illustrated in FIG. 3.

The LDPC decoding circuit 1 illustrated in FIG. 5 is configured by a check node calculating circuit 11, a bit node calculating circuit 12, a hard decision circuit 13, a parity checking circuit 14, an output circuit 15, and a selection circuit 31. To the checking node calculating circuit 11, the bit node calculating circuit 12, and the selection circuit 31, the initial likelihood $F_n$ that is acquired from the reception value of the n-th bit is input.

The check node calculating circuit 11 sets 0 to the variable g and, as described as the process of Step 1(i), acquires $\epsilon_{mn}^{(i)}$ by performing the check node calculation. The check node calculating circuit 11 outputs $\epsilon_{mn}^{(i)}$ to the bit node calculating circuit 12. The check node calculating circuit 11 appropriately increases the variable g by 1 in accordance with a control signal transmitted from the output circuit 15 so as to change the group of the check nodes and repeats the check node calculating.

The bit node calculating circuit 12, as described as the process of Step 1(ii), acquires $z_{mn}^{(i)}$ and $z_n^{(i)}$ by using $\epsilon_{mn}^{(i)}$ acquired by the check node calculating circuit 11. The bit node calculating circuit 12 outputs $z_n^{(i)}$ to the selection circuit 31 and outputs $z_{mn}^{(i)}$ and $z_{mn}^{(i-1)}$ acquired from the previous repeated decoding to the check node calculating circuit 11.

The selection circuit 31, at the time of the initialization, selects $F_n$ and outputs the selected $F_n$ to the hard decision circuit 13. In addition, in a case where $z_n^{(i)}$ acquired by the bit node calculating circuit 12 is supplied, the selection circuit 31 selects $z_n^{(i)}$ and outputs the selected $x_n^{(i)}$ to the hard decision circuit 13.

The hard decision circuit 13, at the time of the initialization, based on $F_n$ selected by the selection circuit 31, performs a hard decision with $w_n^{(0)}=1$ in a case where $F_n>0$ and performs a hard decision with $w_n^{(0)}=0$ in a case where $F_n<0$, thereby acquiring the determination value vector $w=[w_n^{(0)}]$. The hard decision circuit 13 outputs the determination value vector w to the parity checking circuit 14 and the output circuit 15.

In addition, $z_n^{(i)}$ acquired by the bit node calculating circuit 12 is supplied from the selection circuit 31, the hard decision circuit 13 performs a hard decision as described as the process of Step 1 (iii). In addition, the hard decision circuit 13 updates the determination value vector w based on the result of the hard decision and outputs the determination value vector w after the update to the parity checking circuit 14 and the output circuit 15.

The parity checking circuit 14, as described as the process of Step 1 (iv), performs decoding ending condition determining. In other words, the parity checking circuit 14 performs the decoding ending condition determining based on the hard decision value that is newly acquired every time when the bit node calculating for one group ($N_g$) of the bit node.

In a case where the decoding ending condition is determined to be satisfied, the parity checking circuit 14 outputs a signal indicating it to the output circuit 15. On the other hand, in a case where the decoding ending condition is determined not to be satisfied, when the variable g is not G−1, the parity checking circuit 14 outputs a control signal instructing to increase the variable g by one and repeat the calculation. In addition, in a case where the decoding ending condition is determined not to be satisfied, when the variable g is G−1 and i has not arrived at the maximum number of times, the parity checking circuit 14 outputs a control signal instructing to increase i by one and repeat the calculation. The control signal output from the parity checking circuit 14 is supplied from the check node calculating circuit 11 to the bit node calculating circuit 12.

In a case where the signal that indicates that the decoding ending condition is satisfied is supplied from the parity checking circuit 14, the output circuit 15 outputs the determination value vector w as a result of the decoding.

[Result of Simulation]

Figure 6:
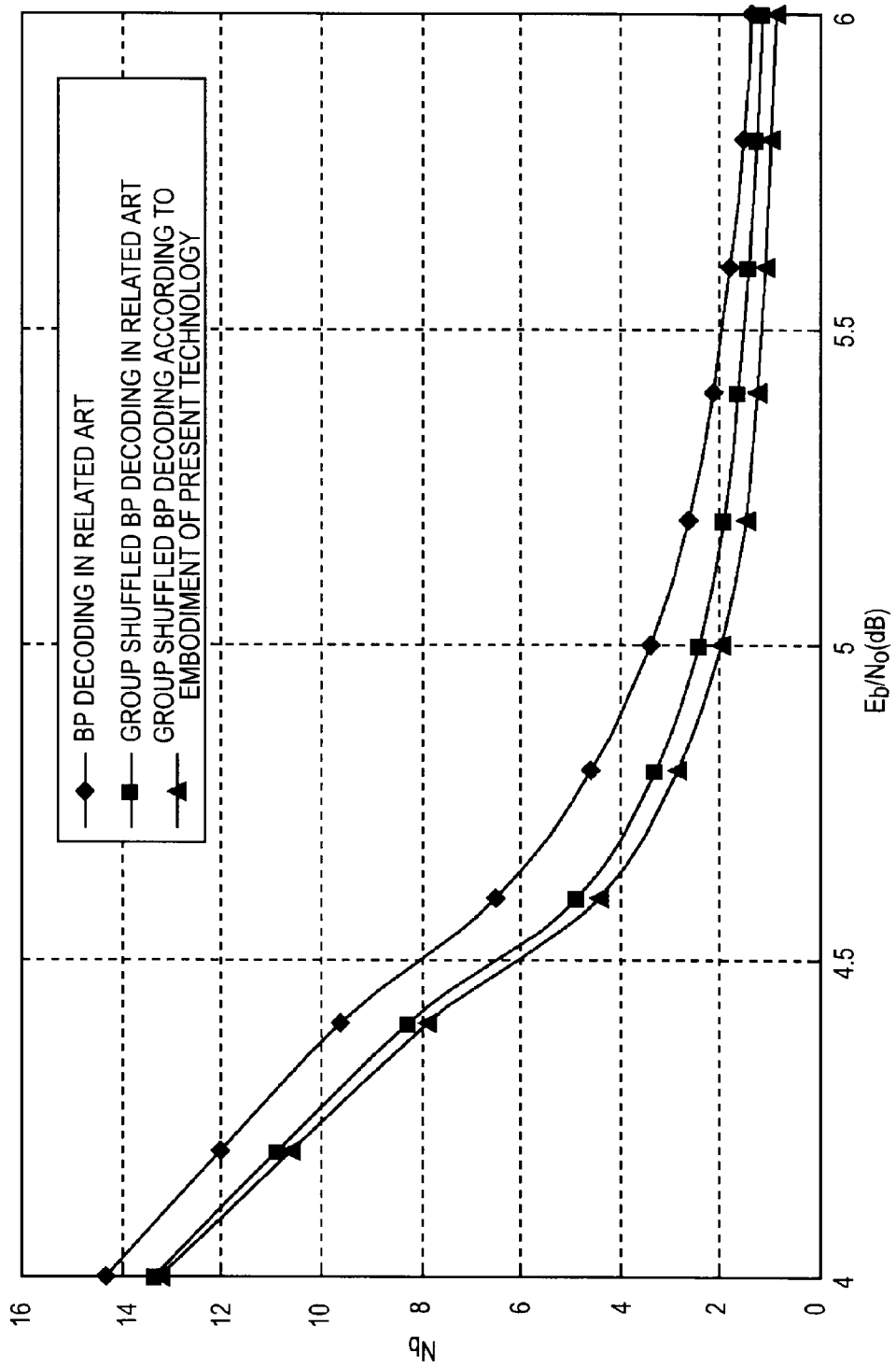
FIG. 6 is a diagram illustrating simulation results.

FIG. 6 is a diagram illustrating results of simulations of the calculation amounts in a case where the LDPC decoding is performed by using a general BP decoding method, a general group shuffled BP decoding method, and a group shuffled BP decoding method according to the embodiment of the present disclosure.

The simulation model is a model in which an LDPC code whose the code bit length is 1440 and whose information bit length is 1344 is modulated by using a BPSK modulation method and is transmitted, and, after the transmission signal passes through a white noise communication path, and the decoding is repeatedly performed while setting the maximum number of repetitions to 16. The horizontal axis of the graph represents the ratio ($E_b/N_0$) of the energy ($E_b$) near the bit to the noise power density ($N_0$), and the vertical axis represents a value ($N_b$) acquired by dividing the average number of bit node calculations by the code bit length.

As illustrated in FIG. 6, in any one of the decoding methods, as the value of $E_b/N_0$ increases, the value of $N_b$ decreases. In the case of the general BP decoding method and the general group shuffled BP decoding method, a bit node calculation of 1440 that is the same as the code bit length is performed in one decoding process. Accordingly, the value acquired by dividing the number of the bit node calculations by the code bit length is the same as the number of repetitions of the decoding process until the end of the processing, which is an integer value equal to or greater than 1 and equal to or less than 16. From FIG. 6, it can be checked that, in all the values of $E_b/N_0$ illustrated in the graphs, the process of the general group shuffled BP decoding is completed with the number of repetitions smaller than that of the general BP decoding process.

Since there is a case where one decoding process ends in the middle of the process, the number of the bit node calculations in a case where the group shuffled BP decoding according to the embodiment of the present disclosure is equal to or less than the number of the bit node calculations in a case where the general group shuffled BP decoding is used. The number of the bit node calculations in a case where the general group shuffled BP decoding is used is represented by a value acquired by the number of repetitions and the code bit length.

From FIG. 6, it can be checked that, in all the values of $E_b/N_0$ illustrated in the graphs, the value of $N_b$ in a case where the group shuffled BP decoding according to the embodiment of the present disclosure is less than that in a case where the general group shuffled BP decoding is used, and the calculation amount is decreased. For example, in a condition that $E_b/N_0=6$ dB, while $N_b=1.16$ in the general group shuffled BP decoding, $N_b=0.87$ in the group shuffled BP decoding according to the embodiment of the present disclosure, and accordingly, the calculation amount is reduced by about 25%.

[Parity Checking Calculation]

When being compared with the general group shuffled BP decoding, in the group shuffled BP decoding according to the embodiment of the present disclosure, the number of the decoding ending condition determinations (the number of parity checking calculations) is about G times that of the case of the general group shuffled BP decoding. A total calculation amounts is not much even in such a case will be described.

Here, it will be focused that the number (the number of elements of the determination value vector w) of the hard decision values $w_n^{(i)}$ updated in Step 1 (iii) is a value in a case where n is in the range of $gN_g \le n < (g+1)N_g$, and the number thereof is $N_g$.

First, the left side of the parity checking equation before the hard decision value $w_n^{(i)}$ is updates in Step 1 (iii) is represented in the following Equation (21). Equation (21) is derived by substituting the variable g represented in Equation (20) with g−1. A value represented on the left side of the parity checking equation before the hard decision value $w_n^{(i)}$ is updated will be denoted by a syndrome $S_m'$.

$$S_m' = \sum_{\substack{n \in N(m) \\ n < gN_g}} H_{mn} w_n^{(i)} + \sum_{\substack{n \in N(m) \\ n \ge gN_g}} H_{mn} w_n^{(i-1)} \quad (21)$$

A new syndrome $S_m$ using the hard decision value $w_n^{(i)}$ after the update updated in Step 1 (iii) can be acquired as the following Equation (22) by using the syndrome $S_m'$.

$$\begin{aligned}
S_m &= \sum_{\substack{n \in N(m) \\ n < (g+1)N_g}} H_{mn} w_n^{(i)} + \sum_{\substack{n \in N(m) \\ n \ge (g+1)N_g}} H_{mn} w_n^{(i-1)} \\
&= \sum_{\substack{n \in N(m) \\ n < gN_g}} H_{mn} w_n^{(i)} + \sum_{\substack{n \in N(m) \\ gN_g \le n < (g+1)N_g}} H_{mn} w_n^{(i)} + \\
&\quad \sum_{\substack{n \in N(m) \\ n \ge gN_g}} H_{mn} w_n^{(i-1)} - \sum_{\substack{n \in N(m) \\ gN_g \le n < (g+1)N_g}} H_{mn} w_n^{(i-1)} \\
&= S_m' + \sum_{\substack{n \in N(m) \\ gN_g \le n < (g+1)N_g}} H_{mn}(w_n^{(i)} - w_n^{(i-1)})
\end{aligned} \quad (22)$$

It is necessary for the parity checking calculation according to the general group shuffled BP decoding to be performed by using all the N hard decision values $w_n^{(i)}$ newly acquired through the hard decision. In contrast to this, according to the calculation of the syndrome $S_m$ in the group shuffled BP decoding according to the embodiment of the present disclosure, it is understood that, when the syndrome $S_m'$ that has been previously calculated and the hard decision value $w_n^{(i-1)}$ that has been acquired in the previous decoding process are stored, differences in the hard decision values of $N_g$ bit nodes updated in this decoding process may be reflected on the syndrome $S_m'$.

The calculation amount of the syndrome $S_m$ is about 1/G of the calculation amount of the parity checking calculation according to the general group shuffled BP decoding based on a difference in the number of the hard decision values $w_n^{(i)}$ used in the calculation. In other words, the calculation amount of the parity checking calculation whose number of times of calculation is increased to about G times for one time is about 1/G. As a result, the calculation amount of the parity checking calculation in the general group shuffled BP decoding and the amount of calculation of the parity checking calculation in the group shuffled BP decoding according to the embodiment of the present disclosure are almost the same.

The group shuffled BP decoding according to an embodiment of the present in which the parity checking calculation described here is built in will now be described.

Initialization:

The LDPC decoding circuit sets 1 to i.

The LDPC decoding circuit sets $F_n$ to each $z_{mn}^{(0)}$.

The LDPC decoding circuit acquires a determination value vector $w=[w_n^{(0)}]$ with $w_n^{(0)}=1$ in a case where $F_n > 0$ and with $w_n^{(0)}=0$ in a case where $F_n < 0$.

The LDPC decoding circuit acquires the syndrome $S_m$ using the determination value vector $w=[w_n^{(0)}]$ by using the following Equation (23).

$$S_m = \sum_{n \in N(m)} H_{mn} w_n^{(0)} \quad (23)$$

In addition, in a case where $S_m=0$ is satisfied for all the values of m ($0 \le m < M$), the LDPC decoding circuit performs the process of Step 3. In other words, in a case where $S_m=0$ is satisfied, the decoding result is output, and the process ends. On the other hand, in a case where $S_m=0$ is not satisfied for all the values of m, the LDPC decoding circuit substitutes $S_m$ with $S_m'$ and performs the process of Step 1.

Step 1:

The LDPC decoding circuit repeats (i) check node calculating (ii) bit node calculating (iii) hard decision, and (iv) decoding ending condition determining while changing the variable g from 0 to G−1.

(i) Check Node Calculating

The LDPC decoding circuit acquires $\epsilon_{mn}^{(i)}$ by using the following Equations (24) and (25) for n satisfying "$gN_g \leq n < (g+1)N_g$" and m satisfying "$m \in M(n)$".

$$\tau_{mn}^{(i)} = \left( \prod_{\substack{n' \in N(m)\backslash n \\ n' < gN_g}} \tanh(z_{mn'}^{(i)}/2) \right) \left( \prod_{\substack{n' \in N(m)\backslash n \\ n' \geq gN_g}} \tanh(z_{mn'}^{(i-1)}/2) \right) \quad (24)$$

$$\varepsilon_{mn}^{(i)} = \log \frac{1 + \tau_{mn}^{(i)}}{1 - \tau_{mn}^{(i)}} \quad (25)$$

(ii) Bit Node Calculating

For n satisfying "$gN_g \leq n < (g+1)N_g$" and m satisfying "$m \in M(n)$", the LDPC decoding circuit acquires $z_{mn}^{(i)}$ by using the following Equation (26) and acquires $z_n^{(i)}$ by using the following Equation (27).

$$z_{mn}^{(i)} = F_n + \sum_{m' \in M(n)\backslash m} \varepsilon_{m'n}^{(i)} \quad (26)$$

$$z_n^{(i)} = F_n + \sum_{m \in M(n)} \varepsilon_{mn}^{(i)} \quad (27)$$

(iii) Hard Decision

For n satisfying "$gN_g \leq n < (g+1)N_g$", the LDPC decoding circuit performs a hard decision as $w_n^{(i)}=1$ in a case where $z_n^{(i)}>0$ and as $w_n^{(i)}=0$ in a case where $z_n^{(i)}<0$. In addition, the LDPC decoding circuit updates the n-th element of the determination value vector w from $w_n^{(i-1)}$ to $w_n^{(i)}$ based on the result of the hard decision.

(iv) Decoding Ending Condition Determining

The LDPC decoding circuit updates the syndrome $S_m$ for a check node (m) belonging to the set of a sum of check nodes m connected to the bit node n that is in the range of $m(gN_g \leq n < (g+1)N_g)$ satisfying $m \in \{\cup M(n)|gN_g \leq n < (g+1)N_g\}$ by using the following Equation (28).

$$S_m = S_m' + \sum_{\substack{n \in N(m) \\ gN_g \leq n < (g+1)N_g}} H_{mn}(w_n^{(i)} - w_n^{(i-1)}) \quad (28)$$

In a case where $S_m=0$ is satisfied for all the values of m ($0 \leq m < M$), the LDPC decoding circuit performs the process of Step 3.

In a case where $S_m=0$ is not satisfied for all the values of m, when the current variable g is not G−1, the LDPC decoding circuit substitutes the syndrome $S_m'$ with $S_m$ acquired from Equation (28), increases the variable g by one, and continues the process of Step 1. On the other hand, in a case where $S_m=0$ is not satisfied for all the values of m, when the current variable g=G−1, the LDPC decoding circuit performs the process of Step 2.

Step 2

In a case where the number of repetitions of the decoding process arrives at the maximum number of times set in advance, the LDPC decoding circuit performs the process of Step 3. On the other hand, in a case where the number of repetitions of the decoding process has not arrived at the maximum number of times set in advance, the LDPC decoding circuit increases i by one and performs the process of Step 1.

Step 3:

The LDPC decoding circuit outputs a determination value vector w as a result of the decoding process.

In the above-described process, at the time of the initialization, a calculation for acquiring the syndrome $S_m'$ based on the determination value vector $w=[w_n^{(0)}]$ is necessary. At this time when $S_m'=0$ is satisfied, it may be configured such that the decoding result at that time point is output, and the process ends without performing the process of Step 1 and Step 2.

Figure 7:
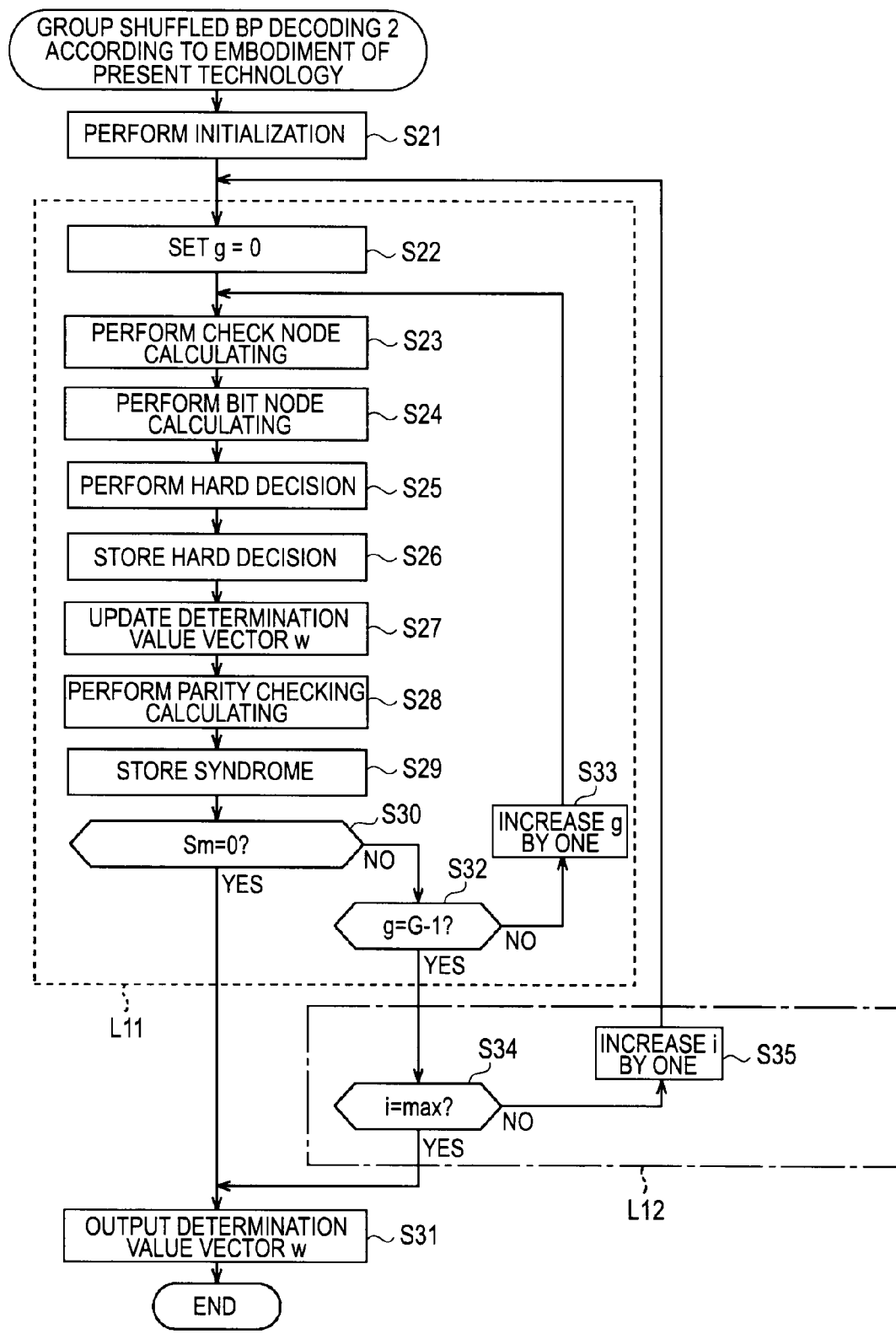
FIG. 7 is a flowchart illustrating the flow of another group shuffled BP decoding process according to an embodiment of the present disclosure.

A series of the flows described above is represented in the flowchart illustrated in FIG. 7. In FIG. 7, the process denoted by being enclosed by a broken line L11 corresponds to the process of Step 1, and the process denoted by being enclosed by a dashed dotted line L12 corresponds to the process of Step 2. Step S21 of FIG. 7 corresponds to the initialization, and Step S31 corresponds to the process of Step 3. As is appropriate, the correspondence between the process of each step and the configuration performing the process of each step will be described.

The LDPC decoding circuit performs an initialization process in Step S21 and sets 0 to the variable g in Step S22. In addition, the LDPC decoding circuit performs check node calculating in Step S23 and performs bit node calculating in Step S24. The LDPC decoding circuit performs a hard decision in Step S25 and stores the hard decision value in Step S26. The process of storing the hard decision value is performed by a hard decision value storing circuit 41 illustrated in FIG. 8 to be described later.

In Step S27, the LDPC decoding circuit updates the determination value vector w based on the result of the hard decision. In Step S28, the LDPC decoding circuit calculates the syndrome $S_m$ by using Equation (28) as a parity checking calculation. In a case where the syndrome $S_m$ acquired in the previous decoding process (the (i−1)-th decoding process) is stored, in the calculation of Equation (28), the syndrome $S_m$ that has been stored is used as the syndrome $S_m'$. In Step S29, the LDPC decoding circuit stores the syndrome $S_m$ acquired by the calculation of Equation (28).

In Step S30, the LDPC decoding circuit determines whether or not $S_m=0$ is satisfied. In a case where $S_m=0$ is determined to be satisfied in Step S30, the LDPC decoding circuit outputs the determination value vector w in Step S31 and ends the process.

On the other hand, in a case where $S_m=0$ is determined not to be satisfied in Step S30, the LDPC decoding circuit determines whether or not the variable g is G−1 in Step S32. In a case where the variable g is determined not to be G−1 in Step S32, the variable g is increased by 1 in Step S33 and the process of Step S23 and after that are repeated.

On the other hand, in a case where the variable g is determined to be G−1 in Step S32, the LDPC decoding circuit determines whether or not i has arrived at the maximum number of times in Step S34. In a case where i is determined not to have arrived at the maximum number of times in Step S34, the LDPC decoding circuit increases the value of the variable i by 1 in Step S35 and repeats the process of Step S22 and after that.

In a case where i is determined to have arrived the maximum number of times in Step S34, the LDPC decoding circuit outputs the determination value vector w in Step S31 and ends the process.

[Configuration of Parity Checking Circuit]

Figure 8:
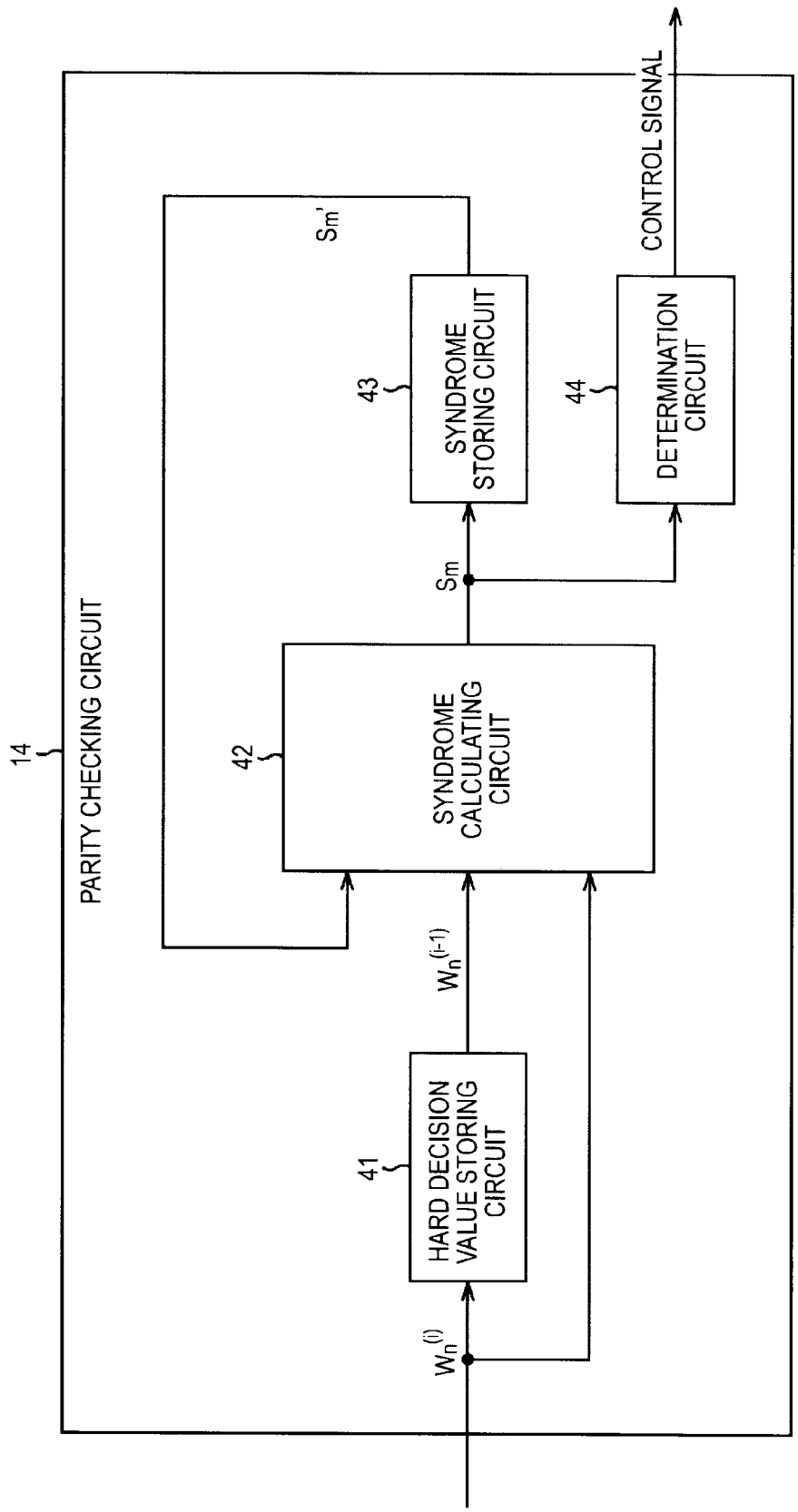
FIG. 8 is a block diagram illustrating a configuration example of a parity checking circuit.

FIG. 8 is a block diagram illustrating a configuration example of a parity checking circuit 14 that stores the syndrome $S_m{}'$ that has been previously calculated as above and the hard decision value $w_n{}^{(i-1)}$ acquired in the previous decoding process and performs decoding ending condition determining.

The parity checking circuit 14 is configured by a hard decision value storing circuit 41, a syndrome calculating circuit 42, a syndrome storing circuit 43, and a determination circuit 44. The hard decision value $w_n{}^{(i)}$ output from the hard decision circuit 13 is input to the hard decision value storing circuit 41 and the syndrome calculating circuit 42.

The hard decision value storing circuit 41 stores the hard decision value $w_n{}^{(i)}$ acquired by the hard decision circuit 13. In addition, when i is increased by one, the hard decision storing circuit 41 outputs the stored hard decision value $w_n{}^{(i)}$ as the $w_n{}^{(i-1)}$ to the syndrome calculating circuit 42.

The syndrome calculating circuit 42, at the time of the initialization, acquires the syndrome $S_m$ using the hard decision value $w_n{}^{(0)}$ acquired by the hard decision circuit 13 by using Equation (23). In addition, in a case where i is equal to or greater than one, the syndrome calculating circuit 42 acquires the syndrome $S_m$ by using Equation (28). In the calculation of the syndrome $S_m$, the syndrome $S_m{}'$ output from the syndrome storing circuit 43 and the hard decision value $w_n{}^{(i)}$ that has been acquired by the hard decision circuit 13 and newly updated, and the hard decision value $w_n{}^{(i-1)}$ output from the hard decision value storing circuit 41 is used. The syndrome calculating circuit 42 outputs the newly-acquired syndrome $S_m$ to the determination circuit 44 by the syndrome storing circuit 43.

The syndrome storing circuit 43 stores the syndrome $S_m$ that has been acquired by the syndrome calculating circuit 42. When the hard decision value $w_n{}^{(i)}$ is newly acquired, the syndrome storing circuit 43 outputs the syndrome $S_m$ that has been stored as the previous syndrome $S_m{}'$ to the syndrome calculating circuit 42.

The determination circuit 44 determines whether $S_m=0$ is satisfied for all the values of m and outputs a control signal used for switching to a decoding ending operation or the continuation of the decoding operation. The control signal output from the determination circuit 44 is supplied to the check node calculating circuit 11 and the bit node calculating circuit 12, which are illustrated in FIG. 5.

Second Embodiment

[Modification of Layered BP Decoding]

A technique in which a decoding ending condition is determined at an interval shorter than that of one decoding process in the repeated decoding, and the process ends in a case where the decoding ending condition is satisfied may be applied to layered BP decoding. The layered BP decoding according to this technique is represented as below.

Initialization:

The LDPC decoding circuit sets 1 to i.

The LDPC decoding circuit sets zero to each $\epsilon_{mn}{}^{(0)}$.

The LDPC decoding circuit acquires a determination value vector $w=[w_n]$ by performing a hard decision with $w_n=1$ in a case where $F_n>0$ and with $w_n{}^{(0)}=0$ in a case where $F_n<0$.

In addition, the LDPC decoding circuit determines whether or not the parity checking equation $Hw=0$ is satisfied and, in a case where the parity checking equation is determined to be satisfied, performs the process of Step 3. On the other hand, in a case where $Hw=0$ is determined not to be satisfied, the LDPC decoding circuit performs the process of Step 1.

Step 1:

The LDPC decoding circuit repeats (i) bit node calculating (ii) check node calculating (iii) hard decision, and (iv) decoding ending condition determining while changing a variable m from 0 to M−1.

In other words, the LDPC decoding circuit performs the bit node calculating and the check node calculating for the first row of the parity checking matrix and then performs the hard decision and the decoding ending condition determining based on the result of the decoding calculation for the first row. In a case where the decoding ending condition is determined to be satisfied through the decoding ending condition determining, the LDPC decoding circuit ends the decoding. On the other hand, in a case where the decoding ending condition is determined not to be satisfied, the LDPC decoding circuit performs the same process with the second row and after that sequentially being set as a target.

(i) Bit Node Calculating

For n satisfying "n∈N(m)", the LDPC decoding circuit acquires $z_{mn}{}^{(i-1)}$ by using the following Equation (29).

$$z_{mn}^{(i-1)} = F_n + \sum_{\substack{m' \in M(n) \\ m' < m}} \varepsilon_{m'm}^{(i)} + \sum_{\substack{m' \in M(n) \\ m' > m}} \varepsilon_{m'm}^{(i-1)} \tag{29}$$

(ii) Check Node Calculating

The LDPC decoding circuit acquires $\epsilon_{mn}{}^{(i)}$ by using the following Equations (30) and (31) for n satisfying "n∈N(m)".

$$\tau_{mn}^{(i)} = \prod_{n' \in N(m) \backslash n} \tanh(z_{mn'}^{(i-1)}/2) \tag{30}$$

$$\varepsilon_{mn}^{(i)} = \log \frac{1 + \tau_{mn}^{(i)}}{1 - \tau_{mn}^{(i)}} \tag{31}$$

(iii) Hard Decision

For n satisfying "n∈N(m)", the LDPC decoding circuit acquired $z_n{}^{(i)}$ by using the following Equation (32).

$$z_n^{(i)} = F_n + \sum_{m \in M(n)} \varepsilon_{mn}^{(i)} \tag{32}$$

In addition, the LDPC decoding circuit performs a hard decision as $w_n=1$ in a case where $z_n{}^{(i)}>0$ and as $w_n=0$ in a case where $z_n{}^{(i)}<0$ and updates the determination value vector w.

(iv) Decoding Ending Condition Determining

In a case where the parity checking equation $Hw=0$ is satisfied, the LDPC decoding circuit performs the process of Step 3. On the other hand, in a case where $Hw=0$ is not satisfied, when the current variable m is not M−1, the LDPC decoding circuit increases m by one and continues to perform the process of Step 1. In addition, in a case where $Hw=0$ is not satisfied, when the current variable m is M−1, the LDPC decoding circuit performs the process of Step 2.

Step 2:

In a case where the number of repetitions of the decoding process arrives at the maximum number of times set in advance, the LDPC decoding circuit performs the process of Step 3. On the other hand, in a case where the number of repetitions of the decoding process has not arrived at the maximum number of times set in advance, the LDPC decoding circuit increases i by one and performs the process of Step 1.

Step 3:

The LDPC decoding circuit outputs a determination value vector w as a result of the decoding process.

A series of the flows described above is represented in the flowchart illustrated in FIG. 9. In FIG. 9, the process denoted by being enclosed by a broken line L21 corresponds to the process of Step 1, and the process denoted by being enclosed by a dashed dotted line L22 corresponds to the process of Step 2. Step S51 of FIG. 9 corresponds to the initialization, and Step S59 corresponds to the process of Step 3.

The LDPC decoding circuit performs an initialization process in Step S51 and sets 0 to the variable m in Step S52. As the initialization, the process of setting one to i and the process of setting 0 to the variable m in Step S2 are performed by each circuit of the LDPC decoding circuit 1, and the process of setting zero to $\epsilon_{mn}^{(0)}$ is performed by the check node calculating circuit 11 and the bit node calculating circuit 12. In addition, the process of acquiring the determination value vector $w=[w_n^{(0)}]$ is performed by the hard decision circuit 13 as initialization.

In addition, the LDPC decoding circuit performs bit node calculating in Step S53 and performs check node calculating in Step S54. The bit node calculating of Step S53 is performed by the bit node calculating circuit 12, and the check node calculating of Step S54 is performed by the check node calculating circuit 11.

The LDPC decoding circuit performs a hard decision in Step S55 and updates the determination value vector w based on the result of the hard decision in Step S56. The hard decision of Step S55 and the process of updating the determination value vector w of Step S56 are performed by the hard decision circuit 13.

The LDPC decoding circuit performs a parity checking calculation in Step S57 and determines whether or not the parity checking equation Hw=0 is satisfied in Step S58. The parity checking calculation of Step S57 and the determination of Step S58 are performed by the parity checking circuit 14.

In a case where the parity checking equation Hw=0 is satisfied in Step S58, the LDPC decoding circuit outputs the determination value vector w in Step S59 and ends the process. The process of outputting the determination value vector w is performed by the output circuit 15.

On the other hand, in a case where the parity checking equation Hw=0 is determined not to be satisfied in Step S58, the LDPC decoding circuit determines whether or not the variable m is M−1 in Step S60. In a case where the variable m is determined not to be M−1 in Step S60, the variable m is increased by 1 in Step S61 and the process of Step S53 and after that are repeated.

On the other hand, in a case where the variable m is determined to be M−1 in Step S60, the LDPC decoding circuit determines whether or not i has arrived at the maximum number of times in Step S62. In a case where i is determined not to have arrived at the maximum number of times in Step S62, the LDPC decoding circuit increases the value of the variable i by 1 in Step S63 and repeats the process of Step S52 and after that. The determination of Step S60 is performed by the parity checking circuit 14, and the process of Step S61 is performed by each circuit of the LDPC decoding circuit 1.

In a case where i is determined to have arrived at the maximum number of times in Step S62, the LDPC decoding circuit outputs the determination value vector w in Step S59 and ends the process.

In a layered BP decoding process in the related art, even when a decoding result that satisfies the parity checking equation Hw=0 is acquired in the middle of the first decoding process, after all the check node calculating processes are performed, the decoding ending condition determining is performed. Accordingly, decoding calculations of M times are necessarily performed within one decoding process. On the other hand, according to the layered BP decoding according to the embodiment of the present disclosure, a decoding ending condition is determined during the first decoding process, and accordingly, in a case where a decoding result that satisfies the parity checking equation Hw=0 is acquired through the m<(M−1)-th decoding calculation process, the remaining processes is not necessarily performed, whereby the calculation amount can be reduced. In addition, since the calculation amount is reduced, the power consumption of the device can be suppressed.

In addition, also in the layered BP decoding process according to the embodiment of the present disclosure, it may be configured such that the syndrome $S_m'$ that has been previously calculated and the hard decision value $w_n^{(i-1)}$ that has been acquired by the previous decoding process are stored, and, as described above, the decoding ending condition is determined by using the syndrome.

[Configuration Example of Computer and the Like]

The above-described series of the processes may be performed by either hardware or software. By realizing the above-described process as software, a time that is necessary for the LDPC decoding process can be shortened.

In the case where the series of the processes is performed by the software, a program configuring the software is installed to a computer in which dedicated hardware is built in, a general-purpose computer, or the like from a program recording medium.

FIG. 10 is a block diagram illustrating an example of the hardware configuration of a computer that performs the above-described series of the processes in accordance with a program.

A CPU (Central Processing Unit) 51, a ROM (Read Only Memory) 52, a RAM (Random Access Memory) 53 are interconnected through a bus 54.

In addition, an input/output interface 55 is connected to the bus 54. To the input/output interface 55, an input unit 56 formed by a keyboard, a mouse, or the like and an output unit 57 that is formed by a display, a speaker, or the like are connected. In addition, a storage unit 58 that is formed by a hard disk, a non-volatile memory, or the like, a communication unit 59 configured by a network interface or the like, and a drive 60 that drives a removable medium 61 are connected to the input/output interface 55.

In the computer configured as described above, for example, as the CPU 51 loads the program stored in the storage unit 58 into the RAM 53 through the input/output interface 55 and the bus 54 and executes the program, whereby the above-described series of the processes are performed.

The program executed by the CPU 51, for example, is recorded on a removable medium 61 or provided through a wired or wireless transmission medium such as a local area network, or the Internet, a digital broadcast and is installed into the storage unit 58.

In addition, the program executed by the computer may be a program that performs the process in a time series in accordance with the sequence described here or a program that performs the process in a parallel manner or performs the process at a necessary timing such as a time when it is called.

The embodiment of the present disclosure is not limited to the above-described embodiment and may be variously changed therein in the scope not departing from the concept of the present disclosure.

For example, the present disclosure may have the following configuration.

(1) A decoding device including a determination unit that determines whether or not a decoding ending condition is satisfied at an interval shorter than an interval of one decoding process in repeated decoding and ends the process in the middle of the one decoding process in a case where the decoding ending condition is satisfied.

(2) The decoding device according to (1) described above, wherein the decoding ending condition is to satisfy a parity checking equation of a linear block code.

(3) The decoding device according to (2) described above, wherein the linear block code is an LDPC code.

(4) The decoding device according to (3) described above, wherein a bit node calculating unit that divides a bit node calculation into a plurality of processes and performs the plurality of processes and a bit determining unit that acquires a partial bit determining value based on a result of the process performed in a divided manner and performs decoding, every time the process divided by the bit node calculating unit is performed are further included, and the determination unit determines whether or not the decoding ending condition is satisfied based on the bit determining value acquired by the bit determining unit.

(5) The decoding device according to (4) described above, wherein a syndrome storing unit that stores a syndrome acquired at a time when a determination of whether or not the decoding ending condition is satisfied is performed immediately before by the determination unit and a determining value storing unit that stores the bit determining value acquired by the bit determining unit at the time of the previous decoding process are further included, and the determination unit updates the syndrome stored in the syndrome storing unit based on a difference between the bit determining value acquired by the bit determining unit in the decoding process of this time and the bit determining value stored in the bit determining value storing unit and determines whether or not the decoding ending condition is satisfied based on the updated syndrome.

(6) The decoding device according to any one of (1) to (5) described above, wherein the determination unit determines whether or not the decoding ending condition is satisfied before starting a first decoding process and does not perform the repeated decoding in a case where the decoding ending condition is satisfied.

(7) The decoding device according to any one of (1) to (6) described above, wherein a check node calculating unit that divides check node calculating into a plurality of processes and performs the plurality of processes is further included, and the bit determining unit acquires the bit determining value based on a result of the process performed in a divided manner every time the process divided by the check node calculating unit is performed.

The present disclosure contains subject matter related to that disclosed in Japanese Priority Patent Application JP 2011-043720 filed in the Japan Patent Office on Mar. 1, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A decoding device comprising:
a determination unit that determines whether or not a decoding ending condition is satisfied at an interval shorter than an interval of one decoding process in repeated decoding and ends the process in the middle of the one decoding process in a case where the decoding ending condition is satisfied, wherein the decoding ending condition is to satisfy a parity checking equation of a linear block code, and wherein the linear block code is an LDPC code;
a bit node calculating unit that divides a bit node calculation into a first plurality of processes and performs the first plurality of processes;
a bit determining unit that acquires a partial bit determining value based on a result of the first plurality of processes performed in a divided manner and performs decoding, every time the first plurality of processes divided by the bit node calculating unit are performed, wherein the determination unit determines whether or not the decoding ending condition is satisfied based on the partial bit determining value acquired by the bit determining unit;
a syndrome storing unit that stores a syndrome acquired at a time when the determination of whether or not the decoding ending condition is satisfied is performed immediately before by the determination unit;
a determining value storing unit that stores the partial bit determining value acquired by the bit determining unit at the time of a previous decoding process,
wherein the determination unit updates the syndrome stored in the syndrome storing unit based on a difference between the partial bit determining value acquired by the bit determining unit in the present decoding process and the partial bit determining value stored in the determining value storing unit and determines whether or not the decoding ending condition is satisfied based on the updated syndrome.

2. The decoding device according to claim 1, wherein the determination unit determines whether or not the decoding ending condition is satisfied before starting a first decoding process and does not perform the repeated decoding in a case where the decoding ending condition is satisfied.

3. The decoding device according to claim 1, further comprising:
a check node calculating unit that divides a check node calculation into a second plurality of processes and performs the second plurality of processes,
wherein the bit determining unit acquires the partial bit determining value based on a result of the second plurality of processes performed in a divided manner every time the second plurality of processes divided by the check node calculating unit is performed.

4. A decoding method comprising:
dividing a bit node into a first plurality of groups;
performing a bit node calculation for each of the first plurality of groups, wherein the bit node calculation is performed sequentially starting from a first group of the first plurality of groups to a last group of the first plurality of groups; and
determining whether or not a decoding ending condition is satisfied every time when the bit node calculation is performed for a group of the first plurality of groups, wherein when the decoding ending condition is satisfied at a particular group of the first plurality of groups, the bit node calculation is not performed for the remaining groups in the first plurality of groups.

5. The decoding method according to claim 4, wherein the decoding ending condition is to satisfy a parity checking equation of a linear block code.

6. The decoding method according to claim 4, wherein the linear block code is a Low Density Parity Check (LDPC) code.

7. The decoding method according to claim 4, further comprising:
acquiring a partial bit determining value corresponding to each of the groups of the first plurality of groups based on the bit node calculation of the respective groups; and
performing decoding every time the bit node calculation is performed for a group of the first plurality of groups.

8. The decoding method according to claim 7, wherein whether or not the decoding ending condition is satisfied at the particular group of the first plurality of groups is determined based on the acquired partial bit determining value of the particular group.

9. The decoding method according to claim 7, further comprising:
storing a syndrome acquired at a time when a determination of whether or not the decoding ending condition is satisfied is performed;
storing the partial bit determining value acquired at the time of the previous decoding process, wherein the stored syndrome is updated based on a difference between a present partial bit determining value and the stored partial bit determining value.

10. The decoding method according to claim 9, wherein whether or not the decoding ending condition is satisfied is determined based on the updated syndrome.

11. The decoding method according to claim 7, further comprising:
dividing a check node into a second plurality of groups; and
performing a check node calculation for each of the second plurality of groups, wherein the partial bit determining value is acquired based on the check node calculation of the respective groups in the second plurality of groups.

12. A non-transitory computer readable storage medium having stored thereon, a computer program having at least one code section executable by a computer, thereby causing the computer to perform the steps comprising:
dividing a bit node into a first plurality of groups;
performing a bit node calculation for each of the first plurality of groups, wherein the bit node calculation is performed sequentially starting from a first group of the first plurality of groups to a last group of the first plurality of groups; and
determining whether or not a decoding ending condition is satisfied every time when the bit node calculation is performed for a group of the first plurality of groups, wherein when the decoding ending condition is satisfied at a particular group of the first plurality of groups, the bit node calculation is not performed for the remaining groups in the first plurality of groups.

\* \* \* \* \*